(12) United States Patent
Afzali-Ardakani et al.

(10) Patent No.: US 7,582,534 B2
(45) Date of Patent: Sep. 1, 2009

(54) CHEMICAL DOPING OF NANO-COMPONENTS

(75) Inventors: Ali Afzali-Ardakani, Yorktown Heights, NY (US); Phaedon Avouris, Yorktown Heights, NY (US); Jia Chen, Ossining, NY (US); Christian Klinke, Ossining, NY (US); Christopher B. Murray, Ossining, NY (US); Dmitri V. Talapin, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 478 days.

(21) Appl. No.: 10/991,582

(22) Filed: Nov. 18, 2004

(65) Prior Publication Data

US 2006/0105523 A1    May 18, 2006

(51) Int. Cl.
  *H01L 21/336* (2006.01)
(52) U.S. Cl. .................. 438/287; 438/289; 977/742; 977/938
(58) Field of Classification Search ......... 438/287–308; 977/938–943
  See application file for complete search history.

(56) References Cited

U.S. PATENT DOCUMENTS

| | | | | |
|---|---|---|---|---|
| 6,528,816 | B1 * | 3/2003 | Jackson et al. | 257/40 |
| 6,891,227 | B2 | 5/2005 | Appenzeller et al. | |
| 2002/0130311 | A1 | 9/2002 | Lieber et al. | |
| 2003/0042562 | A1 * | 3/2003 | Giebeler et al. | 257/421 |
| 2005/0199731 | A9 * | 9/2005 | Empedocles et al. | 235/491 |
| 2006/0073667 | A1 * | 4/2006 | Li et al. | 438/311 |

FOREIGN PATENT DOCUMENTS

| | | |
|---|---|---|
| CN | 1491419 | 4/2004 |
| WO | WO-02/080195 | 10/2002 |

OTHER PUBLICATIONS

Murray et al.,Synthesis and Characterization Monodisperse Nanocrystals ans Xlose-Packed Nanocrystal Assemblies; Annu. Rev. Mater. Sci. 2000, 30 :545-610.
Shim et al., Polymer Functionalization for Air-Stable n-Type Carbon Nanotube Filed-Effect Transistors J. Am. Chem. Soc. 123, 11512 (2001).
Bakkers et al., Synthesis of InP Nanotubes; J. Am. Chem. Soc. 2003, 125; 3440-3441.
Kong et al., Semiconductor Zn-ZnO Core-Shell Nanoblets and Nanotubes; J. Phys. Chem. B. 2004, 108; 570-574.
Thess et al., Crystalline Ropes of Metallic Carbon Nanotubes; Science, vol. 273, 483-487 (Jul. 26, 1996).
Radosavljevic et al., High Performance of potassium n-doped carbon nanotube field-effect transistors; Appl. Phys. Lett. vol. 84, No. 18 3693-3695 (May 3, 2004).

(Continued)

*Primary Examiner*—H. Jey Tsai
(74) *Attorney, Agent, or Firm*—Connolly Bove Lodge & Hutz LLP

(57) ABSTRACT

A method is provided for doping nano-components, including nanotubes, nanocrystals and nanowires, by exposing the nano-components to an organic amine-containing dopant. A method is also provided for forming a field effect transistor comprising a nano-component that has been doped using such a dopant.

23 Claims, 10 Drawing Sheets

OTHER PUBLICATIONS

Poznyak et al., Quantum Dot Chemiluminescence; Nano Letters 2004, vol. 4, No. 4, 693-698.

Morgan et al., Electronic transport in films of colloidal CdSe nanocrystals; Phys. Rev. B. 66, 075339 (2002).

Yu et al., n-Type Conducting CdSe Nanocrystal Solids; Science vol. 300, 1277-1280 (May 2003).

Yu et al., Variable Range Hopping Conduction in Semiconductor Nanocrystal Solids; Phys. Rev. Lett. vol. 92, No. 21, 21602 (May 2004).

Drain Voltage Scaling in Carbon Nanotube Transistors; M. Radsavljevic, S. Heinze, J. Tersoff and Ph. Avouris; Appl. Phys. Lett. 83, 2435 (2003).

Javey et al.,Ballistic carbon nanotube field-effect transistors; Nature vol. 424, 654-657 (Aug. 2003).

Javey et al, "Advancements in Complementary Carbon Nanotube Fields-Effects Transistors", IEDM Conf. 2003.

Murray et al., Colloidal synthesis of nanocrystals and nanocrystal superlattices; IBM J. res. Dev. vol. 45, No. 1 47-55 (Jan. 2001).

Wind et al., Vertical scaling of carbon nanotube field-effect transistors using top gate electrodes; Appl. Phys. Lett., vol. 80, No. 20, 3817-3819(May 2002).

Javey et al., Carbon Nanotube Field-Effect Transistors with integrated Ohmic Contacts and High-k Gate Dielectrics; Nano Lett. vol. 4, No. 3, 450-447 (2004).

Derycke et al., Controlling doping and carrier injection in carbon nanotube transistors; Appl. Phys. Lett. vol. 80, No. 15, 2773-2275 (2002).

Kong et al., Science 287, 622 (2001).

Designing PbSe Nanowores and Nanorings through Oriented Attachments of Nanoparticles; Cho, K.-S.; Talapin, D.V. ; gaschler, W.; Murray, C.B.; J.Am. Chem. Soc.; (Article); 2005; 127(19); 7140-7147.

Greytak et al.,Growth and transport properties of complementary germanium nanowore filed-effect transistors; Appl. Phys. Lett. vol. 84, No. 21, 4176-4178 (2004).

Afzali et al., Reaction of polyaniline with NMP at elevated temperatures; Polymer vol. 38, No. 17, 4439-4443(1997).

Controlling Energy-Level Alignments at Carbon Nanotube/Au Contacts; Cui, X.; Freitag, M.;Martel, R.; Brus, L.; Avouris, P.; Nano Lett.; (Letter); 2003; 3(6); 783-787.

* cited by examiner

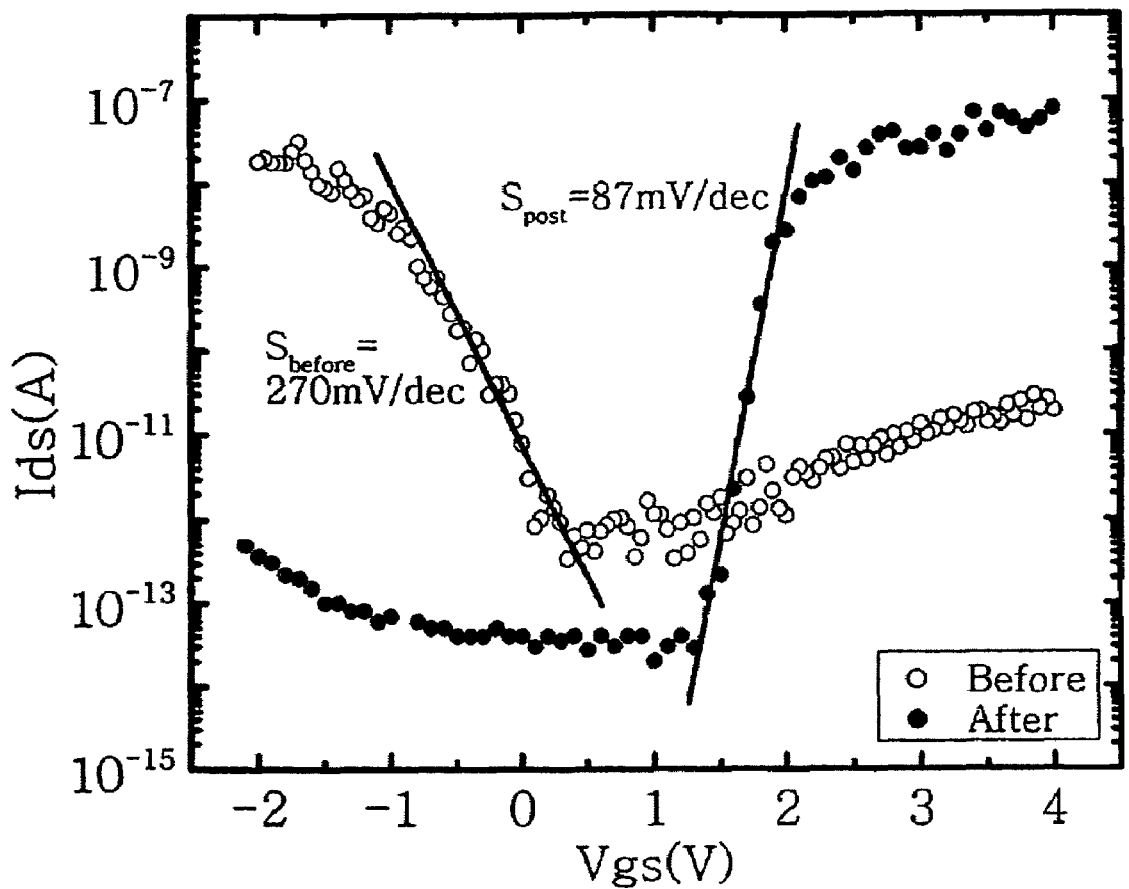
FIG. 2 - Transfer characteristics of CNFET before & after hydrazine doping

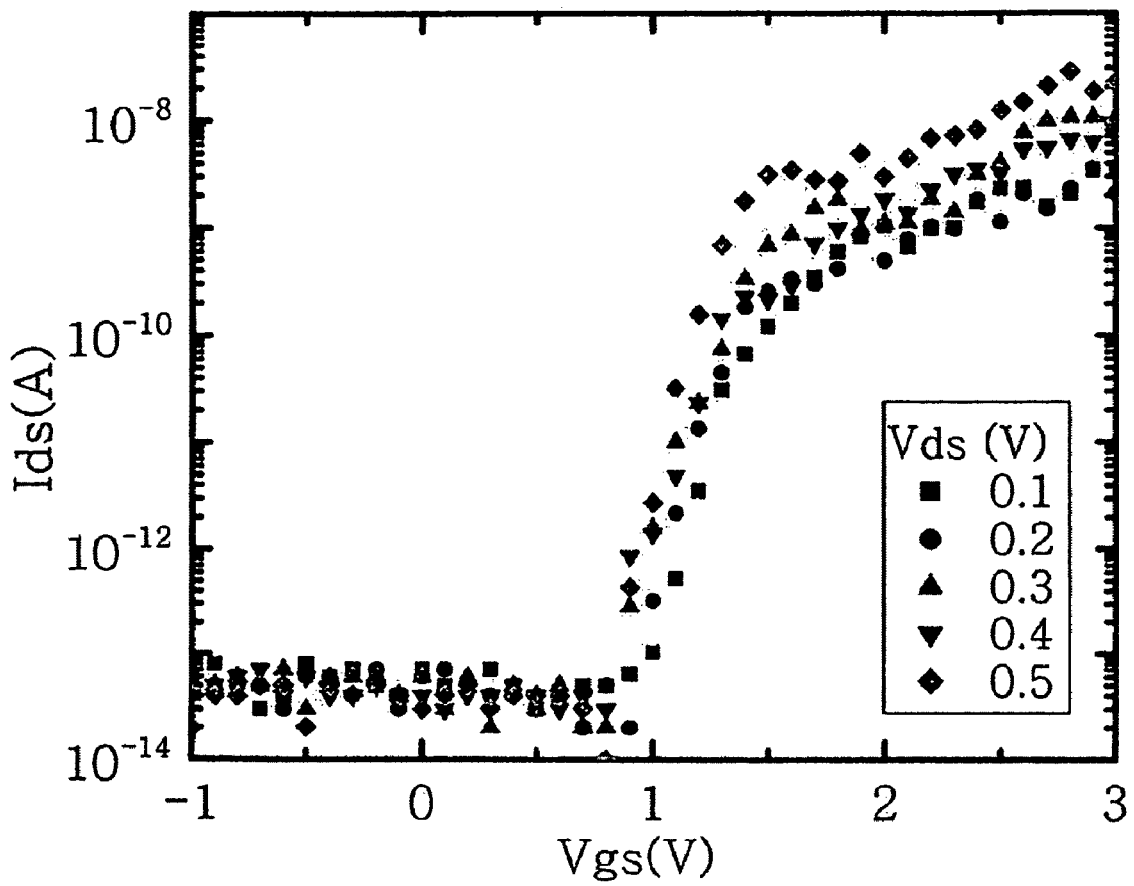
Fig.3 - Dependence on Vds.
CNFET after hydrazine doping

CHEMICAL DOPING OF NANO-COMPONENTS

FIELD OF THE INVENTION

The present invention relates to nanostructures and particularly to methods of doping nano-components, and forming devices incorporating these nano-components.

BACKGROUND OF THE INVENTION

In the field of molecular nanoelectronics, semiconductor nanocrystals, nanowires and nanotubes are showing increasing promise as components of various electronic devices. Semiconductor nanocrystals, for examples, have physical properties significantly different from those of bulk materials. The strong dependency of electronic structure of semiconductor nanocrystals on the nanocrystal size and shape provides additional options for the design and optimization of their material properties [Murray et al., Annu. Rev. Mater. Sci., 30, 542 (2000)]. Moreover, the ability of semiconductor nanocrystals to form stable colloidal solutions allows their integration into electronic devices by inexpensive and high-throughput solution based processes like spin-coating and jet-printing. The films of close-packed nanocrystals exhibit extremely poor conductivities [Morgan et al., Phys. Rev. B. 66, 075339 (2002)], thus hindering their application in electronic devices. Recently it has been shown that electrochemical doping of semiconductor nanocrystals results in significant improvement of their conductivity [Yu et al., Science 300, 1277 (2003); Yu et al., Phys. Rev. Lett. 92, 216802 (2004)]. However, electrochemical doping is not suitable for use in solid state electronic devices because it requires the presence of liquid electrolytes. Thus, there is a need for alternative methods of doping nanocrystals.

Other nano-components such as semiconductor nanowires [Lieber et al., US Published Application US 2002/0130311 A1] and carbon nanotubes are also important elements of nanoelectronics. Nanotubes are unique for their size, shape, and physical properties, and depending on their electrical characteristics, have been used in electronic devices such as diodes and transistors.

Although much progress has been made on carbon nanotube (CN) based transistors in terms of both fabrication and understanding of their performance limits [Javet et al., Nature 424, 654 (2003); Javey et al., "Advancements in Complementary Carbon Nanotube Field-Effect Transistors", IEDM Conference 2003; Wind et al., Appl. Phys. Lett. 80, 3817 (2002); Favey et al., Nano Lett. 4, 447 (2004)], there are still key issues to be addressed for potential technological applications. In particular, there has been no process-compatible doping method for CN field effect transistors (CNFET). Unlike doping in CMOS processes, CNFET cannot be doped substitutionally via ion implantation due to damages to the CN lattice. It is known that CNFETs fabricated from as-grown CNs under ambient conditions show p channel conduction due to oxygen interactions at the metal-CN interface [Derycke et al., Appl. Phys. Lett. 80, 2773 (2002)]. However, the oxygen content at the metal-CN interface can easily be changed by standard fabrication processes (e.g., any post processing involving vacuum pumping such as thin film deposition). In fact, a p-CNFET can be easily converted to an ambipolar or n-CNFET via vacuum pumping. Although n-CNFETs can be formed by alkali metals [Derycke et al., Appl. Phys. Lett. 80, 2773 (2002)] or gas-phase ($NH_3$) doping [Kong et al., Science 287, 622 (2000)], a controlled environment is required to prevent dopant desorption, because upon exposure to air, these devices quickly degrade and may become non-operational. Shim et al. has demonstrated the use of polyethyleneimine (PEI) for n-doping of CNFETs [Shim et al., J. Am. Chem. Soc. 123, 11512 (2001)]. However, additional alternative methods are still needed to provide consistent and stable doping for technologically viable CNFETs.

For semiconductor nanowires, n-doping of nanowires using gas-phase dopants has been demonstrated [Greytak et al., Appl. Phys. Lett. 84, 4176 (2004)]. However, after a nanowire has been integrated into a device, it is not easy, or possible, to vary doping level along the nanowire using gas phase doping because the higher temperatures typically used in gas phase doping may not be compatible with other materials already present in the device. Alternative approaches such as solution phase processing provide various advantages, one of which is the ability to allow controlled doping along the nanowire at temperatures compatible with device doping.

SUMMARY OF THE INVENTION

One aspect of the invention provides a method of doping a nano-component comprising the step of exposing the nano-component to a dopant selected from the group consisting of hydrazine, mono-, di-, tri- or tetra-kis trimethylsilylhydrazine, hydrazine derivatives, diazobicycloundecane and polyaniline. Embodiments of the inventions provide for doping of nanotubes, nanowires and nanocrystals. Illustrative examples include doping of carbon nanotubes, PbSe nanowires and PbSe nanocrytal films with hydrazine; and the use of different oxidation states of polyaniline as n-dopant and p-dopant.

Another aspect of the invention provides a method of forming a field effect transistor comprising a nano-component that has been doped with one of these dopants. Yet another aspect of the invention relates to a field effect transistor having a nano-component as a channel that has been doped using one of these dopants.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 2 illustrates the transfer characteristics of a CNFET before and after doping by hydrazine;

FIG. 3 shows the dependence of the transfer characteristics on $V_{ds}$ of a CNFET after hydrazine doping;

To facilitate understanding, identical reference numerals have been used, where possible, to designate identical elements that are common to the figures.

DETAILED DESCRIPTION

Figure 1A:
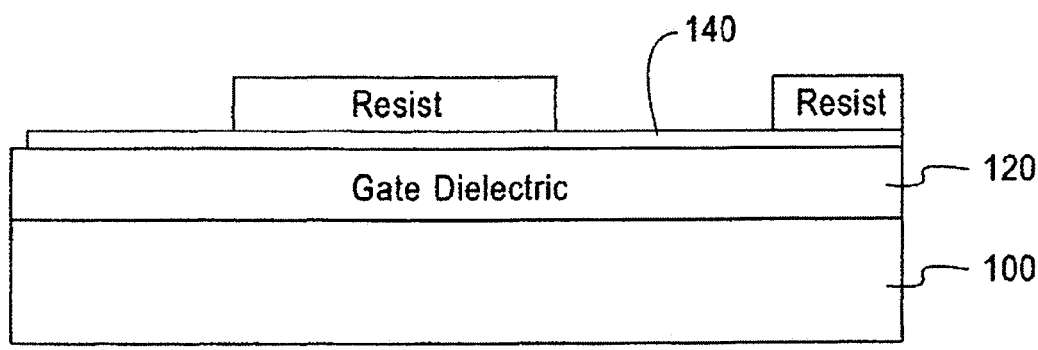
FIGS. 1A-1D illustrates a method of forming a FET according to one embodiment of this invention.

One aspect of the present invention relates to a method of doping a nano-component (nano-structure) by exposing the nano-component to a suitable organic amine-containing dopant. The nano-component includes semiconducting nanotubes, e.g., carbon nanotubes, semiconductor nanocrystals and nanowires. The nano-component may comprise elements from Groups III, IV, V and VI of the periodic table; e.g., Si, Ge, GaAs, GaP, GaSb, InN, InP, InAs, InSb, CdS, CdSe, CdTe, HgS, HgSe, HgTe, GeS, GeSe, GeTe, PbO, PbS, PbSe, PbTe, and appropriate combinations of two or more of these semiconductors.

Another aspect of the invention relates to a method of forming a device, e.g., a field effect transistor (FET) comprising a n-doped-nano-component. The resulting FET with the n-doped nano-component, which is stable in air, exhibits improved device performance in both on- and off-states.

According to embodiments of this invention, the dopant may be selected from organic amine-containing compounds including hydrazine, mon-, di-, tri- or tetra-kis trimethylsilyl-hydrazine, derivatives of hydrazine, diazobicycloundecane (BDU), or polymeric compounds such as polyaniline. The hydrazine derivatives are preferably compounds with chemical formulae $RHN-NH_2$, where R represents one of alkyl-, aryl-, substituted alkyl, or substituted aryl-group. As discussed below, either p- or n-type doping can be achieved by using different forms of polyaniline, e.g., oxidized or reduced forms.

Doping is preferably conducted in solution phase, although gas phase doping is also feasible. For solution processes, organic solvents such as dichlorobenzene, dichloromethane, ethanol, acetonitrile, chloroform, methanol, butanol, among others, are suitable. It is believed that n-doping is accomplished by charge transfer from the dopants to the nano-components, e.g., interaction of the lone electron pairs of doping molecules with the quantum confined orbitals of semiconductor nanowires and nanocrystals which affects the concentration of carriers involved in charge transport.

Solution phase doping offers a variety of process flexibilities and advantages. For example, nano-components can be doped before and/or after their integration into a circuit on a chip. Nano-components can also be doped locally on the chip using techniques such as inkjet printing. The doping level along a nanowire, nanotube or a nanocrystal film can be varied by masking certain portions (e.g., contacts) of the nano-component with resist and doping only the exposed portions. For device applications, nanowires can be protected from damage by implementing the doping at an appropriate stage during process integration. For example, undoped, poorly conductive nanowires can first be aligned and assembled on a chip by applying external electric fields. The low conductivity protects the nanowires from burning during the alignment step. After alignment and integration into the chip, the conductivity of nanowires can then be significantly enhanced by solution-phase doping to the desired level.

Nanotubes, e.g., carbon nanotubes, can be doped either in bulk by suspension of the nanotubes in a dopant solution, with or without heating; or immersing in the dopant solution a substrate supporting the nanotubes. Although carbon nanotubes are used as examples in the following discussions, doping methods of this invention can also be applied to other semiconducting nanotubes, which may comprise, for example, Si, Ge, GaAs, GaP, GaSb, InN, InP, InAs, InSb, CdS, CdSe, CdTe, HgS, HgSe, HgTe, GeS, GeSe, GeTe, PbO, PbS, PbSe, PbTe, and combinations thereof. Details relating to the synthesis of semiconducting nanotubes can be found, for example, in Bakkers et al., J. Am. Chem. Soc. 125; 3440 (2003); and Kong et al., J. Phys. Chem. B. 108; 570 (2004).

Interaction of carbon nanotubes with the dopants, e.g., via charge transfer, results in the formation of charged (radical cation) moeities close to the nanotubes. Bulk doping can be achieved by stirring a suspension of the carbon nanotubes in a dopant solution at a preferred temperature from about 20° C. to about 50° C., with a dopant concentration preferably from about 1M to about 5M. Depending on the specific dopants and solvents, however, concentration ranging from about 0.0001M to about 10M may be used with temperatures from about 0° C. to about 50° C.

In general, the extent of doping depends on the concentration and temperature of the doping medium, and process parameters are selected according to the specific nano-component, dopant and solvent combination, as well as specific application needs or desired device characteristics. For example, with polyaniline dopant, a concentration from about 0.1 mM to about 100 mM is preferred in order to provide a solution with a viscosity suitable for thin film processing or deposition. It is expected that different nano-components may be doped by using dopant concentration from about 0.0001M to about 10M, preferably from about 0.001M to about 10M, and more preferably, from about 1M to about 5M; at a temperature ranging from about 0° C. to about 50° C., preferably from about 10° C. to about 50° C., and more preferably, from 20° C. to about 50° C.

"Device doping"—i.e., doping the nanotube after it has been incorporated as part of a device structure of substrate, can be achieved by exposing the device or substrate with the nanotube to a dopant solution. By appropriately masking the nanotube, selective doping of portions of the nanotube can be achieved to produce desired doping profiles along the nanotube. A dopant concentration is preferably in the range of about 0.001M to about 10M, more preferably from about 1M to about 5M, and most preferably, from about 1M to about 3M, with the solution temperature preferably from about 10° C. to about 50° C., and more preferably, from about 20° C. to about 50° C. With device doping, the choice of process conditions also depends on compatibility with other materials present on the device or substrate. For example, while lower dopant concentrations tend to be less effective in general, too high a concentration of certain dopants may result in potential corrosion issues. In one embodiment, the doping is done under a $N_2$ atmosphere without stirring or agitation of the solution. However, agitation of the solution is also acceptable as long as it does not cause damage to the device.

With either bulk or device doping, the resulting n-doped carbon nanotube device shows an improvement of drive current by about 1 to about 3 orders of magnitude. Depending on oxide thickness, an increase of threshold voltage by about 0.5 to about 3 volt can be expected. Other improvements include a suppression of electron current in ambipolar transistors, a transformation of a scaled CNFET from ambipolar to unipolar, a ratio of $I_{on}/I_{off}$ ratio of about 3 to about 6 and excellent DIBL. The doped nanotubes are also stable in ambient conditions when exposed to air.

FIGS. 1A-1D illustrates a method of forming a FET according to one embodiment of this invention. A gate dielectric 120 such as silicon dioxide, or oxynitride, or high K material layer is deposited on gate 100, which is generally a doped silicon substrate. In one embodiment, the silicon substrate is degenerately doped. The gate dielectric has a thickness from about 1 to about 100 nm. A nano-component 140, e.g., carbon nanotube, is deposited on gate dielectric 120 by spin-coating. A resist pattern is then formed on the carbon nanotube 140 by conventional lithographic techniques. For example, a resist layer can be deposited over the carbon nanotube 140 and patterned by using e-beam lithography or photolithography. With a positive resist, regions of the resist layer exposed to the e-beam or lithographic radiation are removed by using a developer, resulting in a structure with resist pattern shown in FIG. 1A. The resist pattern formed on the carbon nanotube may have one or multiple separations from about 10 nm to about 500 nm when e-beam lithography is used, and from about 500 nm to about 10 µm with photolithography. The multiple separations correspond to the line and space separations resulting from the respective lithographic techniques, and represent separations between adjacent top gates. The availability of multiple top gates provides flexibility of individual control for different logic applications, e.g., AND, OR, NOR operations.

Figure 1B:
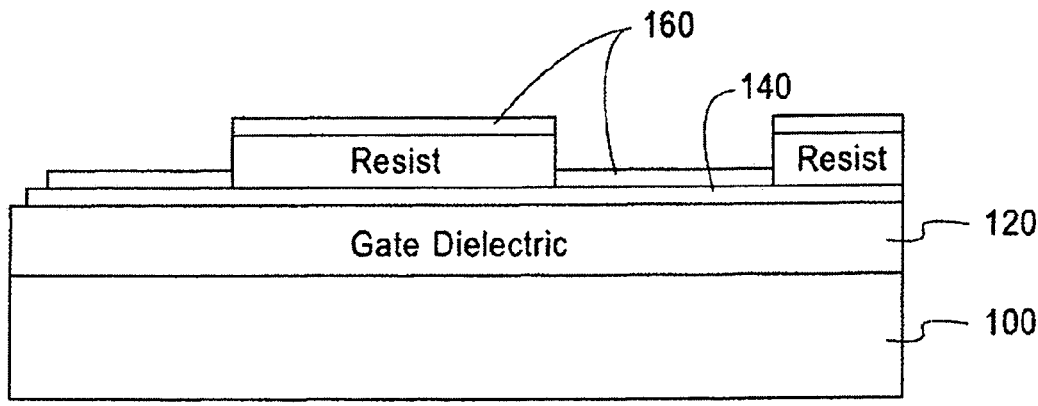

As shown in FIG. 1B, a metal 160, having a thickness ranging from about 15 nm to about 50 nm, is deposited on the resist pattern and over portions of the carbon nanotube 140. The metal can be Pd, Ti, W, Au, Co, Pt, or alloys thereof, or a metallic nanotube. If a metallic nanotube is used, the metal 160 may include one or more metallic nanotubes. Other metals or alloys of Pd, Ti, W, Au, Co, Pt, can be deposited by e-beam or thermal evaporation under vacuum, while metallic nanotubes can be deposited with solution phase techniques such as spin coating. Following deposition of the metal, the structure can be immersed in acetone or N-methylpyrrolidone (NMP) for resist liftoff, a process that removes the lithographically patterned resist and the metal deposited on top by soaking the sample in solvents such as acetone or NMP. For the purpose of this disclosure, such solvents are also referred generally as resist liftoff components. The metal portions 162 and 164 remaining on the carbon nanotube 140 form the FET source and drain. In this embodiment, the source and drains are formed over a first and a second region, respectively, of the carbon nanotube 140, or more generally, of the nano-component 140.

Figure 1C:
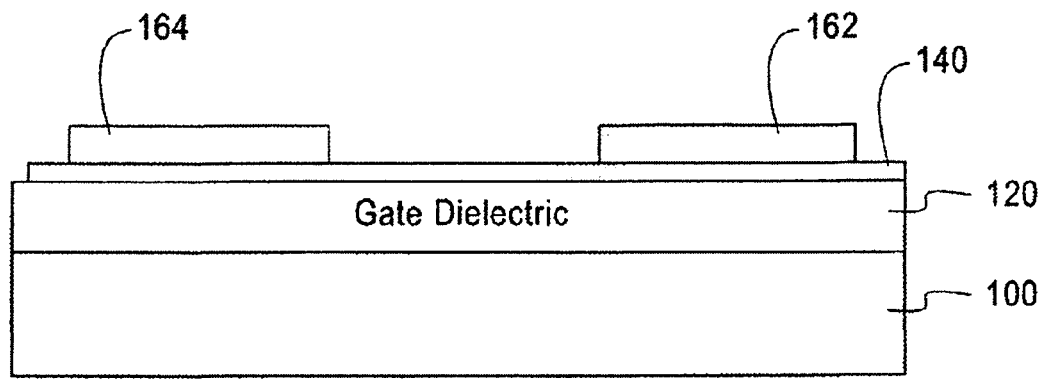
Figure 1D:
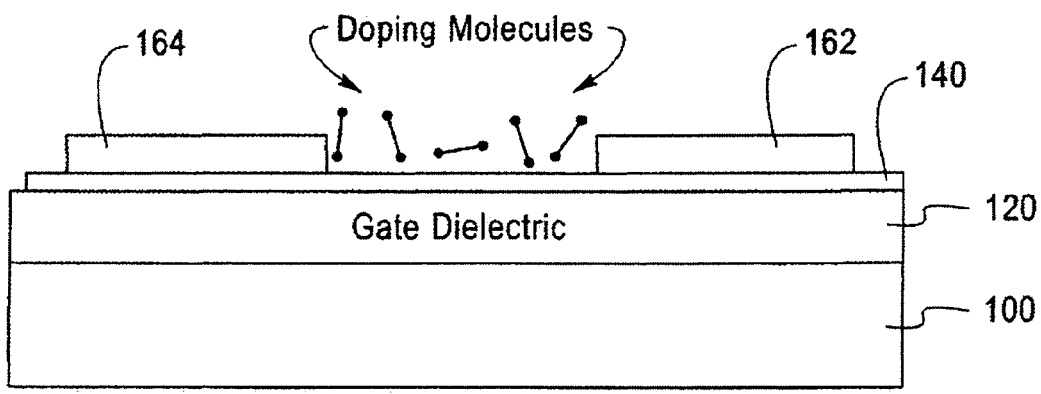

Following resist liftoff, the structure in FIG. 1C with the carbon nanotube 140 is immersed in an organic solution comprising a suitable dopant selected from organic amine-containing compounds including hydrazine, mono-, di-, tri- or tetra-kis trimethylsilylhydrazine, hydrazine derivatives, e.g., with chemical formulae of HRN—NH$_2$, where R represents one of alkyl-, aryl-, substituted alkyl, or substituted aryl-groups, diazobicycloundecane (BDU), and polymeric compounds such as polyaniline. FIG. 1D illustrates the doping molecules bonding to the carbon nanotube 140. The doped portion of the carbon nanotube 140 (between the metal source and drain) acts as the channel of the FET.

In one embodiment, carbon nanotube FETs with laser ablation carbon nanotubes [Thess et al., Science, 273, 483 (1996)] having diameters of about 1.4 nm have been fabricated with titanium source and drain electrodes separated by 300 nm on top of 10 nm thick SiO$_2$ and a Si backgate. The substrate with the fabricated devices is immersed in a 3M solution of hydrazine (N$_2$H$_4$) in acetonitrile for about 5 hours at a temperature of about 50° C. The electron rich di-amine group of hydrazine make it a strong reducing agent. Interaction of the carbon nanotube with N$_2$H$_4$ results in electron injection, as shown in FIG. 2, which illustrates the transfer characteristics (plot of current I$_{ds}$ vs. voltage V$_{gs}$) of the carbon nanotube FET before and after doping. Excess dopants are then removed by rinsing with the solvent. Hydrazine doping can be done at concentration ranging from about 0.1M to about 10M, preferably from about 1 to about 5M, and more preferably around 3M. It was observed that concentrations in the mM range showed insignificant impact on device characteristics. Different solvents, including, for example, dichlorobenzene, dichloromethane, ethanol and acetonitrile, have been investigated for optimal doping effects, with acetonitrile being more effective because of its more polar nature compared to the other solvents. In general, polar solvents are preferred for hydrazine.

After doping with N$_2$H$_4$, the device was transformed from a p-type CNFET to a n-type CNFET, which is indicative of electron transfer from N$_2$H$_4$ to the carbon nanotube, moving the nanotube Fermi level toward the conduction band. A typical transfer characteristics (I$_{ds}$ vs. V$_{gs}$) at V$_{ds}$=−0.5V of a CNFET before and after doping is shown in FIG. 2. The resulting CNFET shows improved device characteristics such as a reduction in the threshold voltage and a three orders of magnitude improvement in the drive current. The threshold voltage reduction is indicative of a shift of the Fermi level of the nanotubes as a result of n-doping, while the drive current improvement is indicative of a change of metal-carbon nanotube interface lineup and a reduction of contact resistance. Other improvements include suppression of the ambipolar branch, possibly due to degenerate doping at the contacts leading to the suppression of the minority carrier (hole) injection and sharpening of the subthreshold slope (87 mV/dec)— an indication of heavy contacts doping and reduction of the metal-carbon nanotube Schottkey barriers.

Compared with n-doped devices using both potassium doping [Radosavljevic et al., Appl. Phys. Lett. 84, 3693 (2004)] and aluminum as source/drain contacts [Javet et al., Nature 424, 654 (2003); Javey et al., "Advancements in Complementary Carbon Nanotube Field-Effect Transistors", IEDM Conference 2003], the subthreshold swing S=dV$_{gs}$/d (logI$_d$) of 87 mV/decade observed for the n-doped CNFET of this invention is the sharpest among these n-doped devices. Furthermore, the V$_{ds}$ dependence shown in FIG. 3 indicates excellent drain-induced-barrier-lowering (DIBL)-like behavior.

Derivatives of hydrazine, e.g., electron donors such mono-, di-, tri or tetra-kis trimethylsilylhydrazine, alkyl-, aryl-, substituted alkyl- or substituted aryl-derivatives, among others, are also expected to be effective n-dopants. One advantage of using hydrazine derivatives as dopants is that other functionalities can be introduced to the nano-components as a result of doping.

Figure 4:
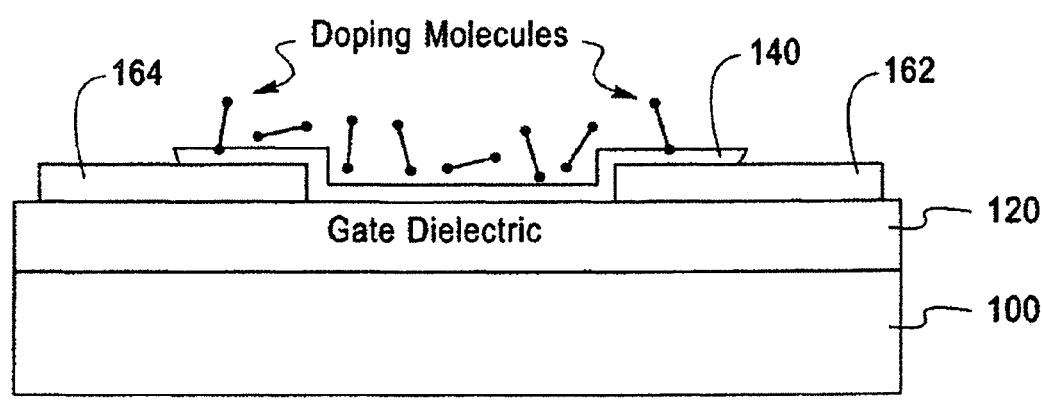
FIG. 4 illustrates another embodiment of forming a CNFET.

FIG. 4 illustrates another embodiment of forming a carbon nanotube FET, or more generally, a FET with a channel comprising a nano-component such as other semiconducting nanotubes, nanowires or nanocrystal films. After the formation of gate dielectric 120 on substrate 100, metal portions 162 and 164 are formed on gate dielectric 120 using a resist liftoff process (not shown) similar to that described for FIGS. 1A-1D. Metal portions 162 and 164, each having a thickness from about 15 nm to about 300 nm, form the FET source and drain. Metals such as Pd, Ti, W, Au, Co and Pt, and alloys thereof, or one or more metallic nanotubes can be used for the metal portions 162, 164. A carbon nanotube 140, or more generally, a nano-component, is then disposed, e.g., by spin-coating, over the gate dielectric 120 and the metal portions 162 and 164. Blanket doping of the carbon nanotube 140 is achieved by immersing the structure in an organic solution comprising a suitable dopant. The dopant molecules bond to the carbon nanotube, e.g., via charge transfer interaction with the nitrogen of hydrazine (or another dopant) donating a lone pair of electrons to the carbon nanotube. In this illustration, the portion of the carbon nanotube 140 in contact with the gate dielectric 120 forms the channel of the FET.

Alternatively, the carbon nanotube 140 can be selectively doped through a patterned resist (not shown) that is formed over the carbon nanotube 140. The patterned resist may be formed, for example, by depositing a suitable resist material over the carbon nanotube 140 and patterning using conventional lithographic techniques. Hydrogensilsesquioxanes (HSQ), a dielectric that can be used as a negative resist, may be used for this purpose.

Figure 5:
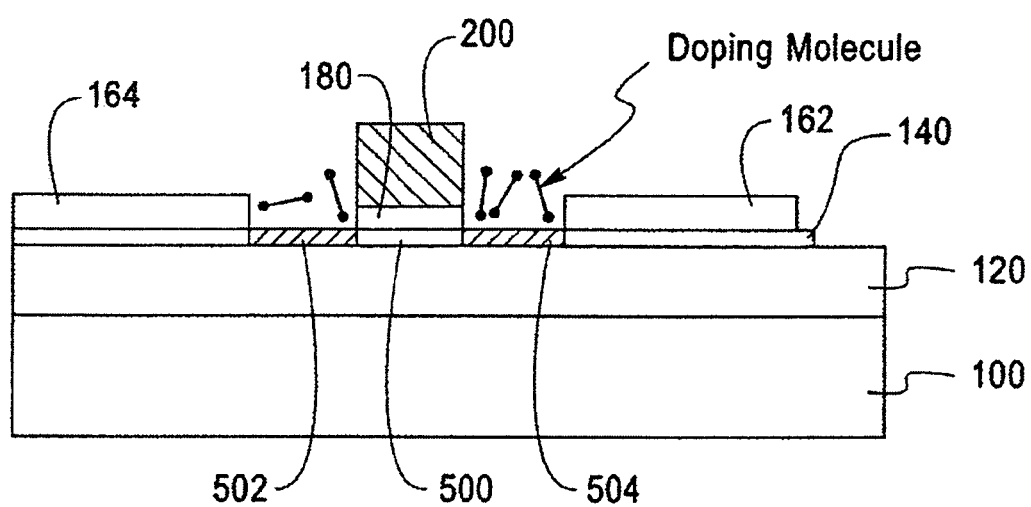
FIG. 5 illustrates an embodiment of a dual-gate CNFET.

FIG. 5 illustrates an embodiment of a dual-gate carbon nanotube FET, or more generally, a FET with a channel comprising a nano-component such as other semiconducting nanotubes, nanowires or nanocrystal films. After the gate dielectric 120 is formed over the substrate 100, which acts as a first gate (also referred to as a bottom or back gate), a carbon nanotube, or more generally, a nano-component 140 is deposited on gate dielectric 120. Metal portions 162, 164 are formed over the carbon nanotube 140 using a resist liftoff technique such as that described in connection with FIGS. 1A-1D. After metal portions 162, 164 are formed (acting as source and drain of the FET), the structure containing the carbon nanotube 140 and metal portions 162, 164 is covered with a dielectric layer 180, which can be a low temperature oxide (LTO) or a CVD high dielectric material such as hafnium dioxide. A second gate 200 (also referred to as top or front gate), which can comprise a metal or highly doped polysilicon, is formed over the dielectric layer 180, e.g., by first depositing a gate material over dielectric layer 180 and then patterning to form top gate 200. With the top gate 200 acting as an etch mask, the dielectric layer 180 is etched such that only the portion underneath the top gate 200 remains, as shown in FIG. 5. As an example, a dilute hydrofluoric acid such as 100:1 HF can be used as an etchant for LTO.

The device is immersed in a dopant solution to achieve partial doping of the carbon nanotube 140. In this case, the channel consists of both the gated undoped region 500 and the two doped regions 502, 504. The doped regions 502, 504 act like the "extensions" of a CMOS FET, resulting in reduced contact barrier and improvements in drive current and transistor switching. The device can be operated by either the top gate 200 or the bottom gate 100, or both. In logic applications, it is desirable to operate a FET with the top gate configuration for good AC performance.

Figure 6A:
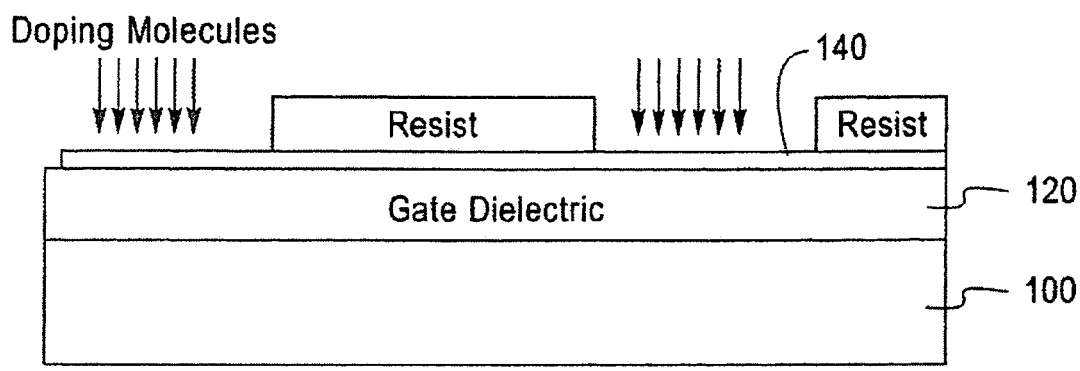
FIGS. 6A-6C illustrate another embodiment of forming a CNFET.
Figure 6B:
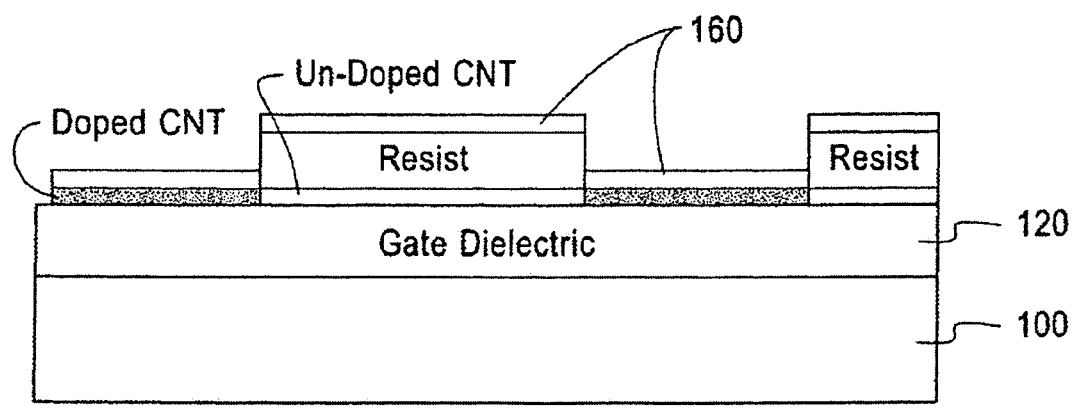
Figure 6C:
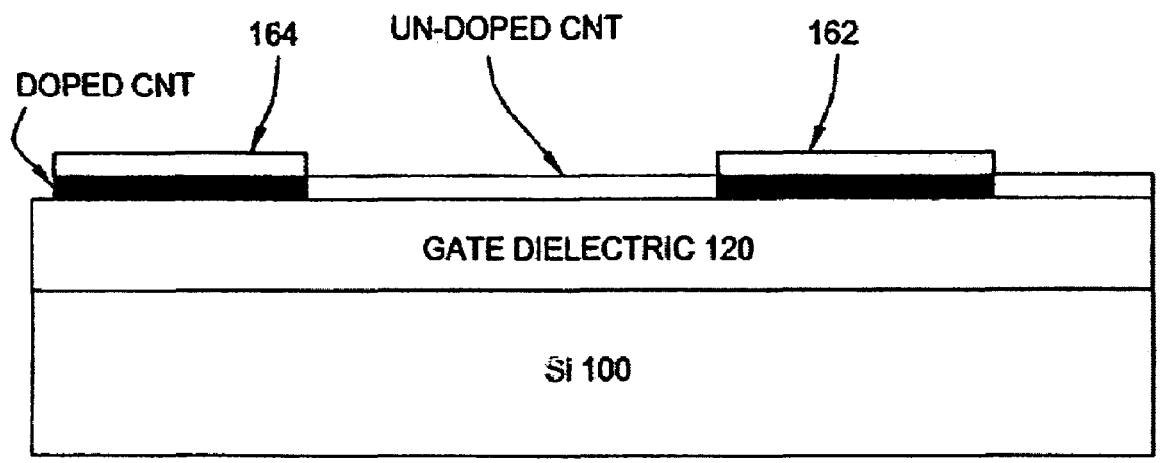

FIGS. 6A-6C illustrate another embodiment of forming a carbon nanotube FET, or more generally, a FET with a channel comprising a nano-component such as other semiconducting nanotubes, nanowires or nanocrystal films. After the carbon nanotube or nano-component 140 is deposited on gate dielectric 120, which has previously been formed over substrate 100, a patterned resist is formed on the carbon nanotube 140 using conventional lithographic techniques such as e-beam or photolithography. The structure (shown in FIG. 6A) containing the patterned resist and carbon nanotube 140 is immersed in an organic solution comprising a suitable dopant. The doping molecules bond to the exposed portions of the carbon nanotube 140. Following doping of the nanotube 140, a metal layer 160 having a thickness ranging from about 15 nm to about 50 nm is deposited over the patterned resist and the doped carbon nanotube 140. As previously described, Pd, Ti, W, Au, Co, Pt, or alloys thereof, or one or more metallic nanotubes can be used for metal 160. Metallic nanotubes can be deposited using solution phase techniques such as spin coating, while electron beam or vacuum evaporation can be used for deposition of other metals or alloys. Following deposition of the metal, the structure shown in FIG. 6B is immersed in acetone or NMP for resist liftoff. As shown in FIG. 6C, metal portions 162, 164 remaining after resist liftoff form the source and drain of the FET. The process of FIGS. 6A-6C generates a significant doping profile difference along the channel of the carbon nanotube transistor. Note that in this case, the undoped portion 500 of the carbon nanotube 140 forms the channel of the FET.

To complete the formation of the FET devices illustrated in FIGS. 1, 4, 5 and 6, passivation can be performed by covering the respective devices with a spin-on organic material like poly(methyl methacrylate) (PMMA) or hydrogensilsesquioxanes (HSQ)—a low K dielectric layer, or by depositing a low temperature dielectric film such as silicon dioxide. Further processing of the device is accomplished via metallization for the back-end of the line.

Figure 7A:
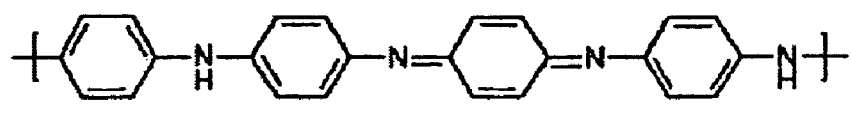
FIGS. 7A-C illustrates the different oxidation states of polyaniline.
Figure 7B:
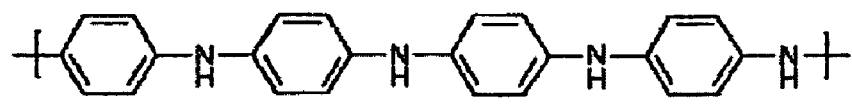
Figure 7C:
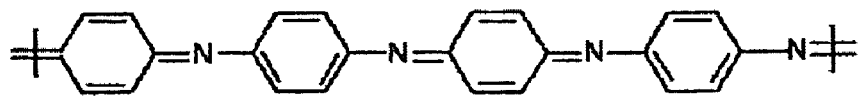

Doping of carbon nanotubes have also been demonstrated using polyaniline. Specifically, reduced and oxidized forms of polyaniline have been shown to be effective n-type and p-type dopants, respectively. FIGS. 7A-C illustrates three distinct oxidation states of polyaniline. The emeraldine (E) state, shown in FIG. 7A, is the most stable form. As purchased (e.g., from Aldrich Chemicals), this partially oxidized and partially reduced form of polyaniline has a mixture of amine (—NH—) and imine (—N= where nitrogen forms a double bond with carbon) groups and partially delocalized electron lone pairs (50% $sp^2$+50% $sp^3$ hybridization).

Complete reduction of emeraldine results in the reduction of all imine moieties to corresponding amines and formation of leucoemeraldine (L), as shown in FIG. 7B. Leucoemeraldine has amine groups (—NH—) that are attached to the benzene rings

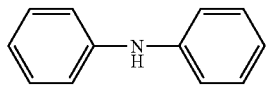

and the electron lone pairs in the amine groups have the least degree of delocalization among the three oxidation states of polyaniline ($sp^3$ hybridization).

The fully oxidized state of polyaniline, pernigraniline (P), shown in FIG. 7C, has imine groups, —N= that resonate with the quinoid ring

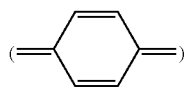

and thus the electron lone pairs in the imine groups have the most degree of delocalization ($sp^2$ hybridization).

As will be shown below, doping of carbon nanotube with leucoemeraldine results in a n-type semiconductor. On the other hand, if emeraldine or leucoemeraldine is oxidized completely to pernigraniline, it acts as a p-dopant for carbon nanotubes. It is expected that other oxidation states of polyaniline, e.g., those that are intermediate between leucoemeraldine and pernigraniline, can also act as dopants for the carbon nanotube, although they may not be as effective as leucoemeraldine and pernigraniline. With emeraldine, some $V_{th}$ shift is observed, but there is no significant n-doping effects. It is possible, however, that n-doping with emeraldine will be effective for devices with very thin oxide or gate dielectric, e.g., less than about 2-4 nm.

In one embodiment, n-doping of carbon nanotube is achieved by using leucoemeraldine, i.e., the reduced form of polyaniline. Subsequent doping by the oxidized form of polyaniline allows the n-type FET to be converted back to a p-type FET. The ability to switch a carbon nanotube FET between p- and n-polarities is believed to be due to changes in charge transfer abilities through different degrees of charge localization of the reduced and oxidized forms of polyaniline. Thus, the use of the redox-active polyaniline as a dopant provides a method of controlled doping of carbon nanotube FETs.

Figure 8:
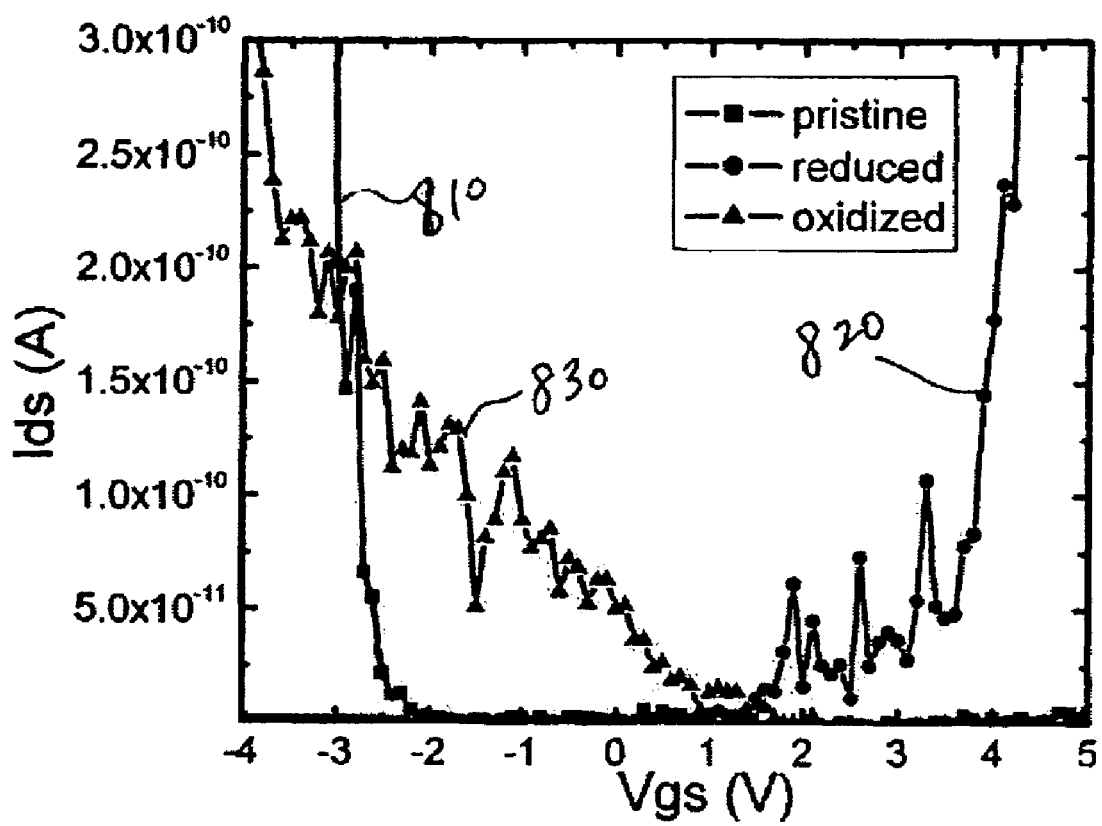
FIG. 8 is a device characteristic plot for a CNFET before and after doping by polyaniline.

In one example, pristine carbon nanotube FETs were fabricated with 1.4 nm diameter laser ablation carbon nanotube as the channel material. The FET has 7 Å Ti/250 Å Pd as source and drain electrodes, a channel length of about 500 nm, 20 nm $SiO_2$ gate dielectric and a Si backgate. Its transfer characteristics at $V_{ds}=-0.5V$ is shown as curve 810 in FIG. 8, corresponding to a typical p-type carbon nanotube FET.

The device was then treated with leucoemeraldine, the fully reduced form of polyaniline. To prepare leucoemeraldine, the as-purchased emeraldine was heated in 1-methylpyrrolidinone (NMP) at about 160° C. for about 2 hr. in a $N_2$ atmosphere, resulting in emeraldine being fully reduced [Afzali et al., Polymer 38, 4439 (1997)]. A dopant solution with NMP as solvent, having a dopant concentration between about 0.01% to about 1%; or about 0.5 mM to about 50 mM, was then spin-coated onto the pristine carbon nanotube FET devices to a thickness of about 10 nm to about 500 nm and heated at about 160° C. in a $N_2$ atmosphere to drive out the solvent. The transfer characteristics of the pristine carbon nanotube FET after leucoemeraldine doping is shown as curve 820 in FIG. 8, where the original p-carbon nanotube-FET was converted to a n-FET. This p to n conversion is also consistent with hydrazine doping results where the lone electron pair on nitrogen ($sp^3$ hybridization) in the amine group transfers electron to carbon nanotube FET and most likely modified the metal-nanotube interface band lineup. To prevent device re-oxidation over time, the sample can be spin-coated with PMMA and baked for an hour at about 100° C. under $N_2$.

One advantage of using polyaniline as a dopant is the ability to convert the n-doped nanotube to p-doped by oxidation. To reduce the charge transfer from polyaniline to carbon nanotube FET, polyaniline was fully oxidized to pernigraniline. The oxidation process was carried out by immersing the leucoemeraldine-covered device in a 1% solution of tetrachloro-1,4-benzoquinone (TCBQ) in 4:1 acetonitrile/dimethylacetamide at 80° C. for 30 min. [Afzali et al. Polymer 38, 4439 (1997)]. The transfer characteristics after the device oxidation process is shown as curve 830 in FIG. 8, where the carbon nanotube FET is converted from n-type back to p-type. This switching of the polarity of a carbon nanotube FET from p- to n- then back to p- is believed to be due to modification of the degree of charge localization of the lone electron pair from $sp^3$ hybridization in the amine group (as in leucoemeraldine) to $sp^2$ hybridization in the imine group (as in pernigraniline). The more delocalized lone electron pair in the imine group in pernigraniline cannot transfer sufficient electron to the carbon nanotube FET to maintain its n-conduction.

According to other embodiments of this invention, nanocrystals and nanowires with semiconductors comprising elements from Groups III, IV, V and VI, e.g., Si, Ge, GaAs, GaP, GaSb, InN, InP, InAs, InSb, CdS, CdSe, CdTe, HgS, HgSe, HgTe, GeS, GeSe, GeTe, PbO, PbS, PbSe, PbTe, and appropriate combinations thereof, can also be n-doped by exposing the nanocrystals and nanowires to a dopant solution. The dopant may be selected from organic compounds including hydrazine, mono-, di-, tri- or tetra-kis trimethylsilylhydraine, derivatives of hydrazine such as $RHN-NH_2$ where R represents alkyl-, aryl-, substituted alkyl- and substituted aryl-groups, diazobicycloundecane (BDU), and polymeric compounds such as leucoemeraldine, the highly reduced form of polyaniline. Furthermore, it is expected that pernigraniline, the fully oxidized form of polyaniline, will also be effective as a p-dopant for these semiconductor nanowires and nanocrystals. Similar to nanotubes, doping of nanocrystals or nanowires may be done in bulk, e.g., by providing a suspensions of nanocrystals or nanowires in a dopant solution.

Alternatively, nanocrystals or nanowires can be supported on a substrate or be incorporated as part of a device, and doped by soaking the substrate or device in a suitable dopant solution. In one embodiment, monodisperse nearly spherical PbSe nanocrystals were synthesized as described by Murray-et al., e.g., IBM J. Res. Dev. 45, 47-55 (2001). In this embodiment, the PbSe nanocrystals were capped with oleic acid as a stabilizing agent, although other organic ligands may also be used. The molecules of the stabilizing agent are attached to the nanocrystal surface during synthesis. The stabilizing agent is typically used to enable the nanocrystals to form stable colloidal solutions, help control nanocrystal growth and protect the nanocrystals from oxidation. An optically clear, uniform film of PbSe nanocrystals, having a thickness of about 50 nm, was obtained by drop-casting and drying a colloidal solution containing 7.3 nm diameter PbSe nanocrystals dissolved in a hexane-octane mixture (volume ratio 9:1).

The PbSe nanocrystal film with a thickness of about 50 nm is supported on a substrate, e.g., as part of a semiconductor device, and immersed in a 1M solution of $N_2H_4$ in acetonitrile at a temperature of about 23° C. for about 3 minutes. The doping results in a significant improvement, e.g., about 5-6 orders of magnitude, in the conductivity of the layer of nanocrystals, specifically, n-type conductivity.

Subsequent treatment of the PbSe nanocrystal film, which leads to cross-linking of the nanocrystals, was carried out by immersing the device in a 5 mM solution of 1,8-octanediamine in ethanol for about 1 minute. Cross-linking of nanocrystals with diamines has been discussed, for example, by Yu et al., Science 300, 1277 (2003), and Poznyak et al., Nano Letters 3, 693 (2004). The film was then annealed at about 70° C. for about 40 min. After cross-linking and anneal, further enhancement of the film conductivity is observed. The doping with hydrazine and cross-linking with 1,8-octanediamine increases conductivity of the film of PbSe nanocrystals by at least 7 orders of magnitude.

In general, depending on the nanocrystal size, shape and size distribution, and preparation conditions, the resulting semiconductor nanocrystal film can have different morphologies due to differences in packing density, packing symmetry and packing disorder. For example, the rate of destabilization of the colloidal solution can result in the formation of a glassy film with short-range ordering of nanocrystals or superlattices with dense packing and long-range order [Murray et al., Ann. Rev. Mater. Sci. 30, 545 (2000)]. Films of nanocrystals with significant shape anisotropy, e.g., nanorods or nanodisks, can have liquid crystalline type of ordering (nematic, smectic-A, smectic-B, etc.) and strongly anisotropic properties [Talapin et al., "CdSe and CdSe/CdS Nanorod Solids", J. Am. Chem. Soc. 126 (40), 12984 (2004)], while dipolar interactions between the nanocrystals, or their ordering on a template like DNA-molecule, etc. can result in one-dimensional chains of semiconductor nanocrystals. The term nanocrystal film, as used herein, is meant to cover any resulting aggregates of nanocrystals, regardless of their specific packing configurations.

In another embodiment, PbSe nanowires incorporated as part of a semiconductor device are exposed to a 1M solution of $N_2H_4$ in acetonitrile at a temperature of about 23° C. for about one minute, resulting in a 2-3 orders of magnitude enhancement in their conductivity, as well as a change in the conductivity of the nanowires from p-type to n-type. As previously mentioned, processing parameters such as the dopant solution concentration, temperature and doping time vary according to the material composition of the nano-components, dopant molecules, chemistry involved, material compatibility and specific application needs. For $N_2H_4$ in acetonitrile, a dopant concentration is preferably between about 0.01M to about 5M, and more preferably, between about 0.5M to about 2M. In general, a concentration range between about 0.001M to about 10M, preferably between about 0.1M to about 5M, more preferably between about 1M to about 5M, and a temperature range of about 10° C. to about 50° C., will be acceptable.

Having described the foregoing embodiments, it is to be noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

We claim:

1. A method of forming a field effect transistor (FET), comprising:
   (a) providing a gate;
   (b) forming a gate dielectric on the gate;
   (c) forming a channel comprising a nano-component on the gate dielectric;
   (d) forming a source over a first region of the nano-component;
   (e) forming a drain over a second region of the nano-component; and
   (f) exposing at least one portion of the nano-component to a dopant selected from the group of hydrazine, mono-, di-, tri- or tetra-kis trimethylsilylhydrazine, a hydrazine derivative, diazobicycloundecane and polyaniline and further comprising, prior to the step (f), the steps of:
   (g) providing a dielectric layer on the nano-component;
   (h) providing a gate material layer on the dielectric layer;
   (i) patterning the gate material layer to form a top gate; and
   (j) patterning the dielectric layer by using the top gate as a mask.

2. The method of claim 1, wherein the nano-component is one of semiconductor nanotube, semiconductor nanocrystal and semiconductor nanowire.

3. The method of claim 1, wherein the nano-component is one of semiconductor nanotube, nanocrystal and nanowire comprising elements of Groups III, IV, V and VI.

4. The method of claim 3, wherein the nano-component comprises at least one of Si, Ge, GaAs, GaP, GaSb, InN, InP, InAs, InSb, CdS, CdSe, CdTe, HgS, HgSe, HgTe, GeS, GeSe, GeTe, PbO, PbS, PbSe, and PbTe.

5. The method of claim 1, wherein the step (f) comprises providing a suspension of the nano-components in a solution containing the dopant.

6. The method of claim 1, wherein the nano-component is a carbon nanotube, and the dopant is one of hydrazine and polyaniline.

7. The method of claim 6, wherein the dopant is hydrazine provided in solution with acetonitrile.

8. The method of claim 7, wherein the solution has a dopant concentration between about 0.1M to about 10M and a temperature between about 20° C. to about 50° C.

9. The method of claim 6, wherein the polyaniline is one of leucoemeraldine and pernigraniline and is provided in solution at a concentration between about 0.5 mM to about 50 mM.

10. The method of claim 1, wherein the dopant is provided in solution at a concentration between about 0.1M to about 10M.

11. The method of claim 1, wherein the hydrazine derivative has a chemical formula $RHN-NH_2$, where R represents one of alkyl-, aryl-, substituted alkyl-, and substituted aryl- groups.

12. The method of claim 1, wherein the nano-component is one of PbSe nanowire and PbSe nanocrystal film.

13. The method of claim 12, wherein the dopant is hydrazine.

14. The method of claim 13, wherein the hydrazine is provided in a solution having a concentration between about 0.001M and about 10M.

15. The method of claim 14, wherein the solution comprises acetonitrile.

16. The method of claim 14, wherein the solution is maintained at a temperature between about 10° C. to about 50° C.

17. The method of claim 1, wherein steps (d) and (e) comprises the steps of:
   applying a resist layer over the nano-component;
   patterning the resist layer;
   depositing a metal layer over the patterned resist layer; and
   exposing the patterned resist layer to a resist liftoff component to remove the patterned resist layer and a portion of the metal layer, thereby leaving other portions of the metal layer to form the drain and the source.

18. The method of claim 1, wherein the at least one portion of the nano-component exposed to the dopant is between the first region and the second region of the nano-component.

19. The method of claim 1, wherein the at least one portion of the nano-component exposed to the dopant comprises the first region and the second region of the nano-component.

20. The method of claim 1, wherein the nano-component is a carbon nanotube.

21. The method of claim 1, wherein the dopant is one of hydrazine and polyaniline.

22. The method of claim 21, wherein the polyaniline is one of leucoemeraldine and pernigraniline.

23. The method of claim 21, wherein the dopant is provided in solution at a concentration between about 0.1M to about 10M for hydrazine, and between about 5.0 mM to about 50 mM for polyaniline.

* * * * *